(12) United States Patent
Akamatsu

(10) Patent No.: US 7,288,807 B1
(45) Date of Patent: Oct. 30, 2007

(54) SEMICONDUCTOR DEVICE WITH CAPACITOR ELEMENT

(75) Inventor: Susumu Akamatsu, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/518,168

(22) Filed: Sep. 11, 2006

(30) Foreign Application Priority Data

Jan. 25, 2006 (JP) ............................ 2006-016214

(51) Int. Cl.
| H01L 27/108 | (2006.01) |
| H01L 29/76 | (2006.01) |
| H01L 29/94 | (2006.01) |
| H01L 31/119 | (2006.01) |

(52) U.S. Cl. ................ 257/296; 257/300; 257/E27.086
(58) Field of Classification Search ................ 257/296, 257/303, 306, 532, 535, 300, E27.086
See application file for complete search history.

(56) References Cited

U.S. PATENT DOCUMENTS 5,822,175 A * 10/1998 Azuma .................... 361/321.5
6,300,653 B1 * 10/2001 Pan ............................ 257/296

FOREIGN PATENT DOCUMENTS

JP          2003-234415          8/2003

OTHER PUBLICATIONS

Kensuke Takahashi et al., "Dual Workfunction Ni-silicide/HfSION Gate Stacks by Phase-Controlled Full-Silicidation (PC-FUSI) Technique for 45 nm-node LSTP and LOP Devices", IEEE, System Devices Research Laboratories, NEC Corporation, 2004.

* cited by examiner

*Primary Examiner*—Hoai V Pham
(74) *Attorney, Agent, or Firm*—McDermott Will & Emery LLP

(57) ABSTRACT

After a capacitor forming portion is formed on a semiconductor substrate by patterning an insulating film and a silicon film, a sidewall insulating film is formed on each of the side surfaces of the capacitor forming portion. Then, the insulating film is selectively removed such that the silicon film is exposed in a depressed portion surrounded by the sidewall insulating film. Subsequently, a first metal film is deposited and then a thermal process is performed to change the silicon film into a first metal film. Thereafter, an insulating film and a second metal film are buried in the depressed portion. The insulating film composes the capacitor insulating film of a capacitor element. The first metal silicide film and the second metal film compose the lower and upper electrodes of the capacitor element, respectively.

9 Claims, 10 Drawing Sheets

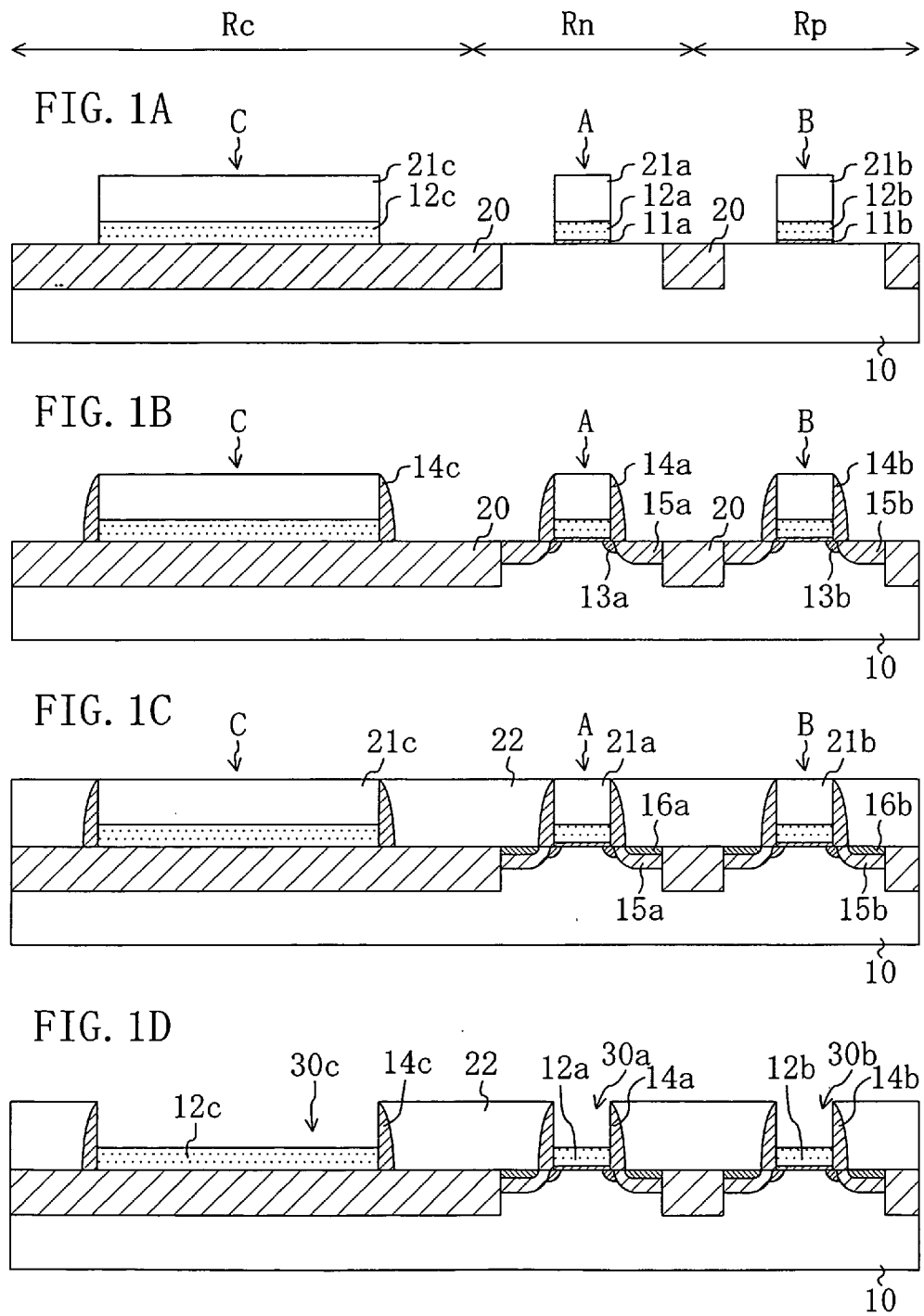

SEMICONDUCTOR DEVICE WITH CAPACITOR ELEMENT

CROSS REFERENCE TO RELATED APPLICATIONS

The teachings of Japanese Patent Application JP 2006-16214, filed Jan. 25, 2006, are entirely incorporated herein by reference, inclusive of the claims, specification, and drawings.

BACKGROUND OF THE INVENTION

The present invention relates to a semiconductor device and a method for fabricating the same and, more particularly, to a semiconductor device comprising a capacitor element and having high process compatibility with a MIS transistor and a method for fabricating the same.

In recent years, as a semiconductor integrated circuit device has become higher in integration and functionality, the integration thereof with an analog circuit or the like has become increasingly important. Of the analog circuit, on the other hand, enhanced process compatibility with a MIS transistor in addition to the formation of a stable capacitor element has been requested.

A conventional MIS transistor including a capacitor element has been formed by fabrication steps as shown in FIGS. 10A to 10D.

That is, as shown in FIG. 10A, an isolation insulating film 102 is formed in a semiconductor substrate 101. Then, a gate insulating film (not shown) and a gate electrode 103 composed of a silicon film are formed on the surface of the semiconductor substrate 101. In a typical case, another gate electrode 103 is also formed on the isolation insulating film 102.

Next, as shown in FIG. 10B, a planarized interlayer insulating film 104 is formed. Subsequently, the capacitor element composed of a lower electrode 105, a capacitor insulating film 106, and an upper electrode 107, each of which has been patterned, is formed on the interlayer insulating film 104.

Then, as shown in FIG. 10C, an interlayer insulating film 108 is further formed. Thereafter, contact holes 110, 111, and 112 are formed in specified regions. Then, as shown in FIG. 10D, a metal 113 is buried in each of the contact holes to connect the lower and upper electrodes 105 and 107 of the capacitor element and the gate electrodes 103 of the MIS transistor to respective wirings 114, whereby the MIS transistor including the capacitor element is completed.

In accordance with the conventional method, however, the lower and upper electrodes 105 and 107 of the capacitor element are formed after the formation of the gate electrode 103 so that the fabrication steps thereof are complicated. In addition, a thermal process for forming the capacitor element is performed after the formation of the MIS transistor. As a result, the problem has been encountered that the impurity profile of the transistor fluctuates.

In solving the problem, a method for rendering the steps of forming the capacitor element compatible with the steps of forming the MIS transistor is useful. Japanese Laid-Open Patent Publication No. 2003-234415 discloses a fabrication method aiming at achieving such process compatibility, which will be described herein below with reference to the step cross-sectional views shown in FIGS. 11A to 11D.

First, as shown in FIG. 11A, isolation insulating films 102a and 102b having different thicknesses are formed in the surface of the semiconductor substrate 101. Then, a gate insulating film (not shown) and the gate electrode 103 composed of a silicon film are formed on the surface of the semiconductor substrate 101, while the lower electrode 105, which is composed of the same silicon film as composing the gate electrode 103, is also formed simultaneously on the thicker isolation insulating film 102b. In a typical case, the other electrode 103 is also formed on the isolation insulating film 102a.

Next, as shown in FIG. 11B, the planarized interlayer insulating film 104 is formed. Then, as shown in FIG. 11C, the interlayer insulating film 104 on the lower electrode 105 is etched back till the thickness of the interlayer insulating film 104 is reduced to a value which allows the capacitor element to have a desired capacitance value. Subsequently, the contact holes 110 and 111 are formed in specified regions.

Finally, as shown in FIG. 11D, the metal 113 is buried in each of the contact holes. Then, the wirings 114 to be connected to the lower electrode 105 of the capacitor element and to the gate electrode 103 of the MIS transistor are formed, while the upper electrode 115 is formed simultaneously, whereby the MIS transistor including the capacitor element is completed.

In accordance with the method, the process steps can be simplified by forming the lower and upper electrodes 105 and 115 of the capacitor element simultaneously with the gate electrodes 103 of the MIS transistor and the wirings 114.

Moreover, by preliminarily forming the isolation insulating film 102b on which the capacitor element is formed such that it is sufficiently thick, the thickness of the interlayer insulating film 104 between the gate electrode 103 formed on the isolation insulating film 102a and the interconnection 114 can be maintained at a value which allows a parasitic capacitance to be ignored when a capacitor insulating film having a desired capacitance value is formed on the lower electrode 105 by etching back the interlayer insulating film 104. Accordingly, even when the process steps are simplified, the characteristics of the semiconductor integrated circuit device are not degraded.

In addition, the capacitor element is formed simultaneously in the steps needed to form the MIS transistor. This prevents the occurrence of the problem that the impurity profile of the transistor fluctuates.

SUMMARY OF THE INVENTION

The method disclosed in the patent publication described above is effective in terms of allowing the simplification of the process steps and allowing a reduction in fabrication cost because the capacitor element is formed simultaneously in the steps of forming the MIS transistor.

However, since the capacitor insulating film of the capacitor element is formed by etching back the interlayer insulating film 104, the thickness control of the capacitor insulating film is not easy. In addition, the etch-back process causes damage to the capacitor insulating film so that the capacitor element has unstable characteristics.

Moreover, since the capacitor element is formed on the isolation insulating film 102b preliminarily formed to have a sufficient thickness, a stepped portion is formed between the capacitor element and the gate electrode of the MIS transistor, which is disadvantageous in terms of increasing the density of a semiconductor integrated circuit element of which planarity is required.

The present invention has been achieved in view of the foregoing and it is therefore an object of the present invention to provide a semiconductor device comprising a capacitor element with excellent planarity and having process compatibility with a MIS transistor and a method for fabricating the same.

A semiconductor device according to the present invention is a semiconductor device comprising a capacitor element, wherein the capacitor element comprises: a capacitor element portion having a lower electrode made of a metal silicide film formed on an isolation region provided in a semiconductor substrate, a capacitor insulating film made of a first insulating film formed on the lower electrode, and an upper electrode made of a metal film formed on the capacitor insulating film; a first sidewall insulating film formed on each of side surfaces of the capacitor element portion; and a second insulating film formed on the semiconductor substrate in lateral relation to the first sidewall insulating film and the capacitor element portion has an upper surface planarized to be flush with an upper surface of the second insulating film.

In the arrangement, the upper surface of the capacitor element portion has been planarized to be flush with the upper surface of the second insulating film formed in lateral relation to the first sidewall insulating film. As a result, the capacitor element with excellent planarity is obtainable. In addition, by forming the MIS transistor using the metal silicide film composing the lower electrode of the capacitor element as the gate electrode and having the first sidewall insulating film formed on each of the side surfaces simultaneously with the capacitor element, the capacitor element and the MIS transistor having respective heights defined by the same first sidewall insulating film can be formed. Therefore, it is possible to obtain a semiconductor device comprising a capacitor element with excellent planarity and having process compatibility with the MIS transistor.

In a preferred embodiment, the present invention provides the semiconductor device, wherein the meal silicide film is made of NiSi or $Ni_2Si$ and the metal film is made of a nickel film.

In another preferred embodiment, the present invention provides the semiconductor device further comprising a first MIS transistor, wherein the first MIS transistor comprises: a first gate portion having a first gate insulating film formed on the semiconductor substrate, a first gate made of a first metal silicide film formed on the first gate insulating film, the first insulating film formed on the first gate electrode, and the metal film formed on the first insulating film; a second sidewall insulating film formed on each of side surfaces of the first gate portion; and the second insulating film formed on the semiconductor substrate in lateral relation to the second sidewall insulating film and the first gate portion has an upper surface planarized to be flush with the upper surface of the second insulating film.

In still another preferred embodiment, the present invention provides the semiconductor device, wherein the first metal silicide film has the same composition ratio as the metal silicide film.

In yet another preferred embodiment, the present invention provides the semiconductor device, wherein the first MIS transistor is an N-type MIS transistor.

In still another preferred embodiment, the present invention provides the semiconductor device further comprising a second MIS transistor, wherein the second MIS transistor comprises: a second gate portion having a second gate insulating film formed on the semiconductor substrate and a second gate electrode made of a second metal silicide film formed on the second gate insulating film; a third sidewall insulating film formed on each of side surfaces of the second gate portion; and the second insulating film formed on the semiconductor substrate in lateral relation to the third sidewall insulating film and the second gate portion has an upper surface planarized to be flush with the upper surface of the second insulating film.

In yet another preferred embodiment, the present invention provides the semiconductor device, wherein the second metal silicide film is metal-richer than the metal silicide film and the second metal silicide film is made of $Ni_3Si$.

In still another preferred embodiment, the present invention provides the semiconductor device, wherein the second MIS transistor is a P-type MIS transistor.

A method for fabricating a semiconductor device according to the present invention is a method for fabricating a semiconductor device comprising a capacitor element having a capacitor element portion, wherein the capacitor element portion has a lower electrode made of a metal silicide film, a capacitor insulating film made of a first insulating film, and an upper electrode made of a metal film, the method comprising the steps of: (a) forming an isolation region in a semiconductor substrate; (b) forming a capacitor forming portion having a first silicon film and a first protective film on the isolation region; (c) forming a first sidewall insulating film on each of side surfaces of the capacitor forming portion; (d) after the step (c), forming a second insulating film on the semiconductor substrate and then planarizing the second insulating film to expose an upper surface of the first protective film; (e) after the step (d), selectively removing the first protective film from the capacitor forming portion; (f) after the step (e), forming the metal silicide film by silicidizing the entire first silicon film; (g) forming the first insulating film covering an upper surface of the metal silicide film; (h) forming the metal film on the first insulating film; and (i) after the step (h), planarizing an upper surface of the metal film of the capacitor element portion such that the upper surface of the metal film is flush with an upper surface of the second insulating film.

In the arrangement, the upper surface of the capacitor element portion is planarized to be flush with the upper surface of the second insulating film formed in lateral relation to the first sidewall insulating film. As a result, the capacitor element with excellent planarity is obtainable. In addition, by forming the MIS transistor using the metal silicide film composing the lower electrode of the capacitor element as the gate electrode and having the first sidewall insulating film formed on each of the side surfaces simultaneously with the capacitor element, the capacitor element and the MIS transistor having respective heights defined by the same first sidewall insulating film can be formed. Therefore, it is possible to obtain a semiconductor device comprising a capacitor element with excellent planarity and having process compatibility with the MIS transistor.

In a preferred embodiment, the present invention provides the method for fabricating a semiconductor device, wherein the meal silicide film is made of NiSi or $Ni_2Si$ and the metal film is made of a nickel film.

In another preferred embodiment, the present invention provides the method for fabricating a semiconductor device, wherein the semiconductor device further comprises a first MIS transistor having a first gate portion, the first gate portion has a first gate insulating film, a gate electrode made of a first metal silicide film, the first insulating film, and the metal film, the step (b) includes forming a first gate forming portion having the first gate insulating film, a second silicon film, and a second protective film on a portion of the semiconductor substrate surrounded by the isolation region, the step (c) includes forming a second sidewall insulating film on each of side surfaces of the first gate forming portion, the step (d) includes planarizing the second insulating film to expose an upper surface of the second protective film, the step (e) includes selectively removing the second protective film from the first gate forming portion, the step (f) includes silicidizing the entire second silicon film to form the first metal silicide film, the step (g) includes forming the first insulating film covering an upper surface of the first metal silicide film, and the step (i) includes planarizing an upper surface of the metal film of the first gate portion such that the upper surface of the metal film is flush with the upper surface of the second insulating film.

In still another preferred embodiment, the present invention provides the method for fabricating a semiconductor device, wherein the semiconductor device further comprises a second MIS transistor having a second gate portion, the second gate portion has a second gate insulating film and a gate electrode made of a second metal silicide film, the step (b) includes forming a second gate forming portion having the second gate insulating film, a third silicon film, and a third protective film on a portion of the semiconductor substrate surrounded by the isolation region, the step (c) includes forming a third sidewall insulating film on each of side surfaces of the second gate forming portion, the step (d) includes planarizing the second insulating film to expose an upper surface of the third protective film, the step (e) includes selectively removing the third protective film from the second gate forming portion, the step (f) includes silicidizing the entire third silicon film to form the second metal silicide film, and the step (i) includes planarizing an upper surface of the second metal silicide film of the second gate portion such that the upper surface of the second metal silicide film is flush with the upper surface of the second insulating film.

In the semiconductor device and the method for fabricating the same according to the present invention, the upper surface of the capacitor element portion has been planarized to be flush with the upper surface of the second insulating film formed in lateral relation to the first sidewall insulating film. As a result, the capacitor element with excellent planarity is obtainable. In addition, by forming the MIS transistor using the metal silicide film composing the lower electrode of the capacitor element as the gate electrode and having the first sidewall insulating film formed on each of the side surfaces simultaneously with the capacitor element, the capacitor element and the MIS transistor having respective heights defined by the same first sidewall insulating film can be formed. Therefore, it is possible to obtain a semiconductor device comprising a capacitor element with excellent planarity and having process compatibility with the MIS transistor.

BRIEF DESCRIPTION OF THE DRAWINGS

FIGS. 1A to 3C are step cross-sectional views schematically showing a method for fabricating a semiconductor device according to a first embodiment of the present invention;

DETAILED DESCRIPTION OF THE PREFERRED EMBODIMENTS

Figure 2A:
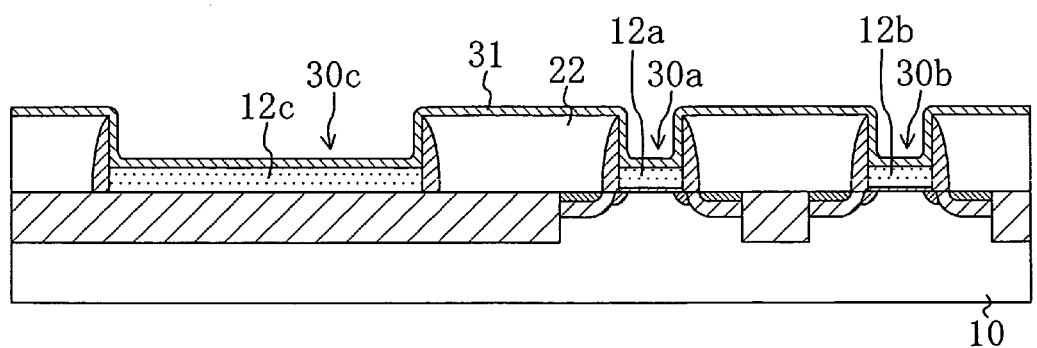

Referring to the drawings, the embodiments of the present invention will be described herein below. Throughout the accompanying drawings, components having substantially the same functions will be denoted by the same reference numerals for the sake of simple illustration. It is to be noted that the present invention is not limited to the following embodiments.

Embodiment 1

FIGS. 1A to 3C are step cross-sectional views schematically showing a method for fabricating a semiconductor device according to the first embodiment of the present invention. Each of the drawings shows a capacitor element formation region Rc on the left-hand side, an N-type MIS transistor formation region Rn at the center, and a P-type MIS transistor formation region Rp on the right-hand side.

First, as shown in FIG. 1A, an isolation region 20 is formed in a semiconductor substrate 10 made of silicon to define the respective active areas of the N-type MIS transistor formation region Rn and the P-type MIS transistor formation region Rp. To improve the planarity between a capacitor element and a complementary MIS transistor (gate electrode), the isolation region 20 preferably has a shallow trench isolation (STI) structure in which, e.g., an insulating film is buried in a trench formed in the semiconductor substrate 10.

Then, a P-type well (not shown) is formed in the N-type MIS transistor formation region Rn of the semiconductor substrate 10 and an N-type well (not shown) is formed in the P-type MIS transistor formation region Rp of the semiconductor substrate 10. Subsequently, a gate insulating film with a thickness of 1.7 nm is formed over the respective active areas of the N-type and P-type MIS transistor formation regions Rn and Rp of the semiconductor substrate 10. Then, a silicon film with a thickness of 40 nm is formed over the entire surface of the semiconductor substrate 10. As the gate insulating film, a high dielectric constant material such as $HfO_2$ or HfSiON is preferably used. Thereafter, a protective film composed of a CVD-oxide film with a thickness of 80 nm is formed on the silicon film.

Then, the protective film, the silicon film, and the gate insulating film are patterned successively by anisotropic etching so that a first gate forming portion A composed of a first gate insulating film 11a, a second silicon film 12a, and a second protective film 21a is formed on the active area of the N-type MIS transistor formation region Rn of the semiconductor substrate 10 and a second gate forming portion B composed of a second gate insulating film 11b, a third silicon film 12b, and a third protective film 21b is formed on the active area of the P-type MIS transistor formation region Rp of the semiconductor substrate 10, while a capacitor forming portion C composed of a first silicon film 12c and a first protective film 21c is formed simultaneously on the isolation region 20 in the capacitor element formation region Rc. At this time, an insulating film composed of the gate insulating film may also be left between the isolation region 20 and the silicon film 12c.

Next, as shown in FIG. 1B, n-type extension regions 13a are formed by self alignment in the respective portions of the N-type MIS transistor formation region Rn of the semiconductor substrate 10 which are located on both lateral sides of the first gate forming portion A. On the other hand, p-type extension regions 13b are formed by self alignment in the respective portions of the P-type MIS transistor formation region Rp of the semiconductor substrate 10 which are located on both lateral sides of the second gate forming portion B.

Thereafter, an insulating film composed of a silicon nitride film is formed over the entire surface of the semiconductor substrate 10 and then subjected to arisotropic dry etching so that sidewall insulating films (second and third sidewall insulating films) 14a and 14b are formed on the respective side surfaces of the first and second gate forming portions A and B, while a sidewall insulating film (first sidewall insulating film) 14c is simultaneously formed on the side surfaces of the capacitor forming portion C.

Then, n-type source/drain regions 15a are formed by self alignment in the respective portions of the N-type MIS transistor formation region Rn of the semiconductor substrate 10 which are located laterally to the sidewall insulating film 14a, while p-type source/drain regions 15b are formed by self alignment in the respective portions of the P-type MIS transistor formation region Rp of the semiconductor substrate 10 which are located laterally to the sidewall insulating film 14b.

Next, as shown in FIG. 1C, silicide films 16a and 16b each made of, e.g., Ni silicide are formed by using a salicide technology on the n-type source/drain regions 15a and on the p-type source/drain regions 15b, respectively. Then, an insulating film (second insulating film) 22 composed of a planarized CVD-oxide film is formed on the portion of the semiconductor substrate 10 on which the first and second gate forming portions A and B and the capacitor forming portion C are not formed. The planarization can be performed by, e.g., depositing the insulating film 22 over the entire surface of the semiconductor substrate 10 and then polishing the insulating film 22 by CMP (Chemical Mechanical Polishing) until the respective upper surfaces of the protective films 21a, 21b, and 21c are exposed.

Next, as shown in FIG. 1D, the protective films 21a, 21b, and 21c are selectively removed from the first gate forming portion A, the second gate forming portion B, and the capacitor forming portion C such that the silicon films 12a, 12b, and 12c are exposed at the respective bottom surfaces of depressed portions 30a, 30b, and 30c surrounded by the sidewall insulating films 14a, 14b, and 14c. The sclective removal of the protective films 21a, 21b, and 21c can be effected by, e.g., performing etching using an etchant with a high selectivity with respect to each of the insulating film 22, the sidewall insulating films 14a, 14b, and 14c, and the silicon films 12a, 12b, and 12c.

Next, as shown in FIG. 2A, a first metal film 31 with a thickness of 30 nm is formed over the entire surface of the semiconductor substrate 10. As a result, each of the silicon films 12a, 12b, and 12c exposed in the respective depressed portions 30a, 30b, and 30c is covered with the first metal film 31. At this time, the first metal film 31 need not necessarily be formed on the upper surface of the insulating film 22. It is sufficient for the first metal film 31 to be formed to cover at least the respective upper surfaces of the silicon films 12a, 12b, and 12c in the depressed portions 30a, 30b, and 30c.

Figure 2B:
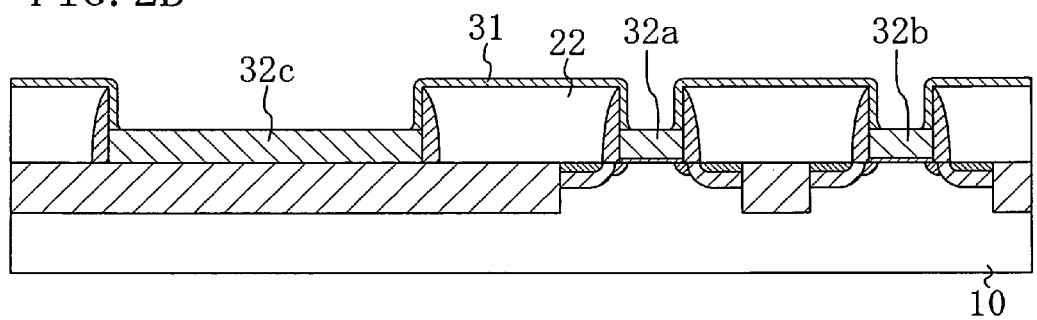

Next, as shown in FIG. 2B, a reaction is caused between each of the silicon films 12a, 12b, and 12c and the first metal film 31 by performing a thermal process with respect to the semiconductor substrate 10, thereby entirely silicidizing the silicon films 12a, 12b, and 12c and changing them into first metal silicide films 32a, 32b, and 32c. At this time, the first metal silicide films 32a, 32b, and 32c are formed through the reaction caused between each of the silicon films 12a, 12b, and 12c and the first metal film 31 by a thermal process. The thickness ratio between each of the silicon films 12a, 12b, and 12c and the first metal film 31 is preliminarily set to provide the metal silicide films at desired composition ratios. For example, when the first metal film 31 is composed of nickel (Ni) material, the thickness ratio between each of the silicon films 12a and 12b and the first metal film 31 is preferably set such that a composition ratio represented by $NiSi$ or $Ni_2Si$ is provided between Ni and Si in each of the first metal silicide film 32a and 32b.

Figure 2C:
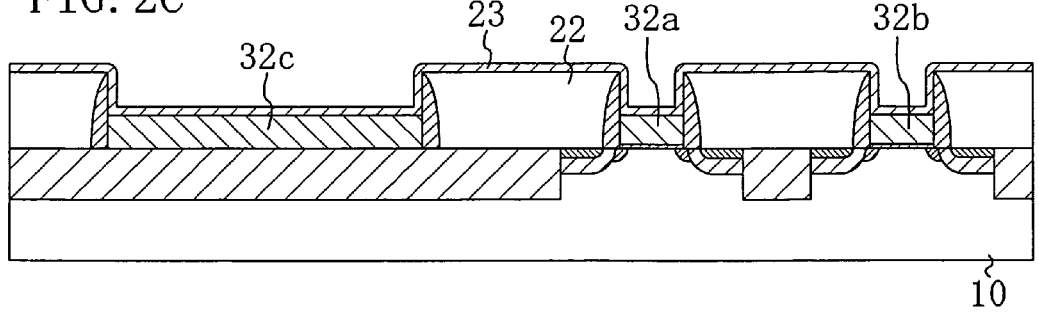

Next, as shown in FIG. 2C, the unreacted portion of the first metal film 31 is removed and then an insulating film (first insulating film) 23 composed of a nitride film with a thickness of 10 nm is formed over the entire surface of the semiconductor substrate 10.

Figure 3A:
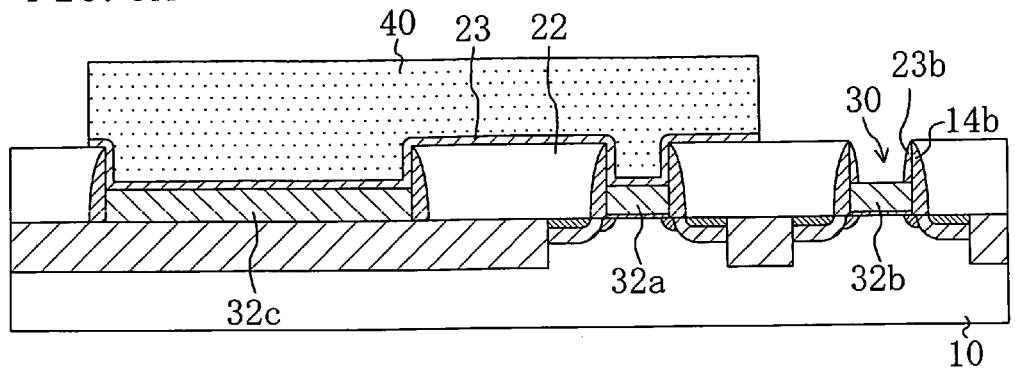

Next, as shown in FIG. 3A, a resist film 40 covering each of the first metal silicide films 32a and 32c and having an opening over the first metal silicide film 32b is formed on the insulating film 23. Then, dry etching is performed with respect to the insulating film 23 by using the resist film 40 as a mask, thereby exposing the upper surface of the first metal silicide film 32b in the P-type MIS transistor formation region Rp. As a result, the insulating film 23 remains to cover the upper surface of the first metal silicide film 32a in the N-type MIS transistor formation region Rn and the first metal silicide film 32c in the capacitor element formation region Rc. At this time, a sidewall insulating film 23b composed of the insulating film 23 also remains on each of those parts of the side surfaces of the sidewall insulating film 14b which are located above the first metal silicide film 32b in the P-type MIS transistor formation region Rp to form the inner side surfaces of the depressed portion 30b. The sidewall insulating film 23b need not necessarily be left. It is also possible to completely etch away the sidewall insulating film 23b.

Figure 3B:
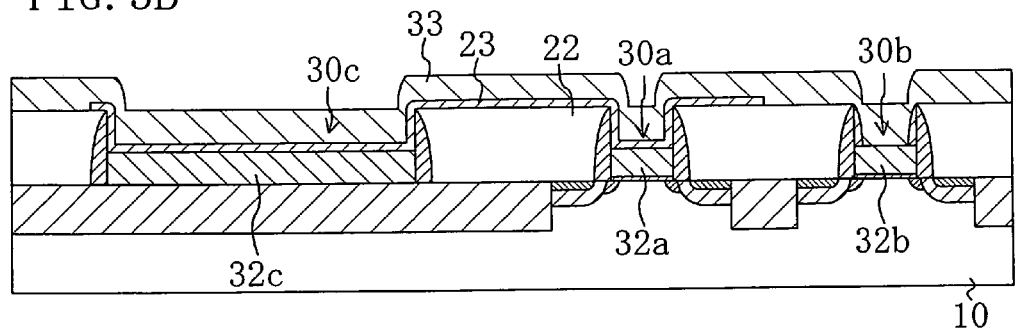

Next, as shown in FIG. 3B, a second metal film 33 with a thickness of 50 nm is formed over the entire surface of the semiconductor substrate 10. At this time, the second metal film 33 is formed to have a thickness such that each of the depressed portions 30a and 30c is completely filled therewith. The second metal film 33 is preferably composed of the same metal material as composing the first metal film 31. For example, when the first metal film 31 is composed of a nickel material, a nickel material is used to compose the second metal film.

Figure 3C:
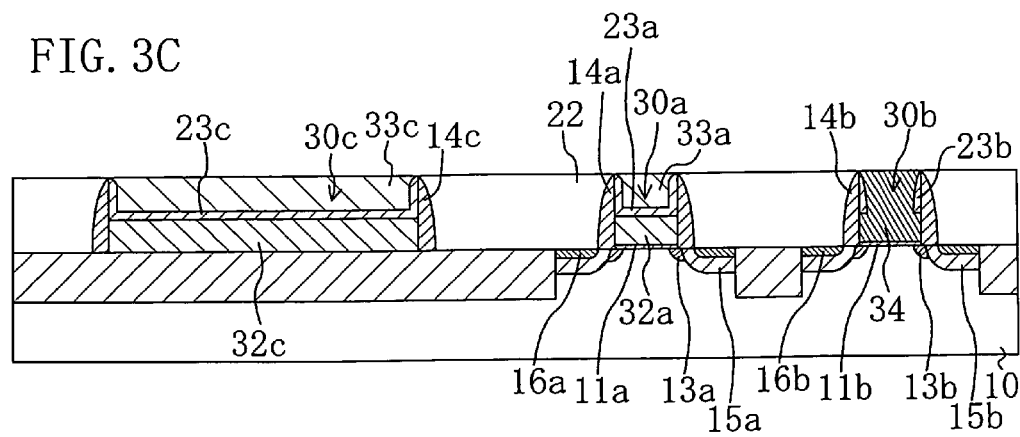

Next, as shown in FIG. 3C, a reaction is caused between the first metal silicide film 32b in the P-type MIS transistor formation region Rp and the second metal film 33 by performing a thermal process with respect to the semiconductor substrate 10 to change the entire first metal silicide film 32b into a metal-richer second metal silicide film 34. For example, when the second metal film 33 is composed of a nickel material, the second metal silicide film 34 is formed through a reaction between $NiSi$ or $Ni_2Si$ composing the first metal silicide film 32b and Ni composing the second metal film 33 so that an Ni- richer $Ni_3Si$ film is formed.

Thereafter, the unreacted portion of the second metal film 33 is removed by polishing using a CMP method until the upper surface of the insulating film 22 is exposed. At this time, the insulating film 23 remaining on the insulating film 22 is also preferably polished away. As a result, a structure is obtained in which the insulating film 23a and 23c each having a depressed cross-sectional configuration and the second metal films 33a and 33c formed on the insulating films 23a and 23c are buried in the depressed portions 30a and 30c located above the first metal silicide films 32a and 32c, respectively.

Thus, an N-type MIS transistor having a gate portion composed of the gate insulating film 11a, the first metal silicide film 32a, the insulating film 23a, and the second metal film 33a is formed in the N-type MIS transistor formation region Rn and a P-type MIS transistor having a gate portion composed of the gate insulating film 11b, the second metal silicide film 34, and the sidewall insulating film 23b is formed in the P-type MIS transistor formation region Rp, while a capacitor element having a capacitor element portion composed of the first metal silicide film 32c, the insulating film 23c, and the second metal film 33c is formed in the capacitor element formation region Rc. The upper surface (upper surface of the second metal film 33a) of the gate portion of the N-type MIS transistor, the upper surface (upper surface of the second metal silicide film 34) of the gate portion of the P-type MIS transistor, and the upper surface (upper surface of the second metal film 33c) of the capacitor element portion of the capacitor element are planarized to be flush with the upper surface of the insulating film 22. It is to be noted that the sidewall insulating film 23b of the gate portion of the P-type MIS transistor need not necessarily be provided.

When the second metal silicide film 34 is formed by a thermal process in the P-type MIS transistor formation region Rp, the insulating films 23a and 23c are interposed between the first metal silicide film 32a and the second metal film 33a in the N-type MIS transistor formation region Rn and between the first metal silicide film 32c and the second metal film 33c in the capacitor element formation region Rc, respectively. This prevents each of the first metal silicide film 32a and 32c from having the same composition ratio as the second metal silicide film 34.

By the fabrication method described above, the N-type MIS transistor is formed in the N-type MIS transistor formation region Rn. The N-type MIS transistor has the gate insulating film 11a formed on the semiconductor substrate 10, a gate electrode composed of the first metal silicide film 32a formed on the gate insulating film 11a, the insulating film 23a formed on the first metal silicide film 32a and having a depressed cross-sectional configuration, the second metal film 33a formed in a depressed portion located above the insulating film 23a, the sidewall insulating film 14a formed on each of the side surfaces of the gate electrode (first metal silicide film 32a), the n-type extension regions 13a formed in the respective portions of the semiconductor substrate 10 which are located below and on both lateral sides of the gate electrode (first metal silicide film 32a), the n-type source/drain regions 15a formed in the respective portions of the semiconductor substrate 10 which are located below and laterally to the sidewall insulating film 14a, and the silicide film 16a formed on each of the n-type source/drain regions 15a.

Each of the insulating film 23a and the second metal film 33a is formed above the first metal silicide film 32a in the depressed portion 30a surrounded by the sidewall insulating film 14a and the upper surface of the second metal film 33a has been planarized to be substantially flush with the upper surface of the insulating film 22 and the upper end of the sidewall insulating film 14a.

On the other hand, the P-type MIS transistor is formed in the P-type MIS transistor formation region Rp. The P-type MIS transistor has the gate insulating film 11b formed on the semiconductor substrate 10, a gate electrode composed of the second metal silicide film 34 formed on the gate insulating film 11b, the sidewall insulating film 14b formed on each of the side surfaces of the gate electrode (second metal silicide film 34), the p-type extension regions 13b formed in the respective portions of the semiconductor substrate 10 which are located below and on both lateral sides of the gate electrode (second metal silicide film 34), the p-type source/drain regions 15b formed in the respective portions of the semiconductor substrate 10 which are located below and laterally to the sidewall insulating film 14b, and the silicide film 16b formed on each of the p-type source/drain regions 15b. The upper surface of the second metal silicide film 34 is planarized to be substantially flush with the upper surface of the insulating film 22 and the upper end of the sidewall insulating film 14b. On the upper part of each of the inner side surfaces of the sidewall insulating film 14b, the sidewall insulating film 23b having the bottom surface thereof substantially flush with the bottom surface of the insulating film 23a has been formed.

In the capacitor element formation region Rc, the capacitor element is formed. The capacitor element has a lower electrode composed of the first metal silicide film 32c formed on the isolation region 20, a capacitor insulating film composed of the insulating film 23c formed on the first metal silicide film 32c and having a depressed cross-sectional configuration, and an upper electrode composed of the second metal film 33c formed in a depressed portion located above the insulating film 23c. The insulating film 23c and the second metal film 33c are formed above the first metal silicide film 32c in the depressed portion 30c surrounded by the sidewall insulating film 14c. The upper surface of the second metal film 33c has been planarized to be substantially flush with the upper surface of the insulating film 22 and the upper end of the sidewall insulating film 14c.

As described above, according to the present embodiment, the upper surface (upper surface of the second metal film 33c) of the capacitor element portion of the capacitor element is planarized to be flush with the upper surface of the insulating film 22, similarly to the upper surface (upper surface of the second metal film 33a) of the gate portion of the N-type MIS transistor and to the upper surface (upper surface of the second metal silicide film 34) of the gate portion of the P-type MIS transistor. As a result, a semiconductor device with excellent planarity can be obtained. In addition, since the capacitor element having the lower electrode composed of the first metal silicide film 32c can be formed simultaneously with the N-type MIS transistor having the gate electrode composed of the first metal silicide film 32a, the fabrication steps for the semiconductor device including the capacitor element can be simplified. Moreover, since the first metal silicide film 32a composing the gate electrode of the N-type MIS transistor and the second metal silicide film 34 composing the gate electrode of the P-type MIS transistor can be composed of metal silicide films having different composition ratios, the threshold voltage of the complementary MIS transistor can be controlled to a proper value.

Although the present embodiment has been described by using a nickel material for each of the first and second metal films 31 and 33, the material of each of the first and second metal films 31 and 33 is not particularly limited provided that it forms a metal silicide film by reacting with a silicon film. However, a refractory metal such as Ti, Co, Mo, or Pt is used preferably.

Embodiment 2

Although the method for fabricating the semiconductor device according to the present invention has been described by using the step cross-sectional views shown in FIGS. 1A to 3C, a structure which extracts a potential at the lower electrode of the capacitor element to the surface of the semiconductor substrate (which is typically an interlayer insulating film formed on the semiconductor substrate) is preferably adopted for easy electrical connection between the capacitor element composing the semiconductor device and another element such as a transistor.

Therefore, the second embodiment of the present invention will describe a specific method for extracting the potential at the lower electrode of the capacitor element to the surface of the semiconductor substrate (interlayer insulating film).

EXAMPLE 1

FIGS. 4A to 5D are step cross-sectional views showing a first example of the method for extracting the potential at the lower electrode. Since the steps other than the steps of extracting the potential at the lower electrode are the same as those illustrated in FIGS. 1A to 3C, the detailed description thereof will be omitted.

Figure 4A:
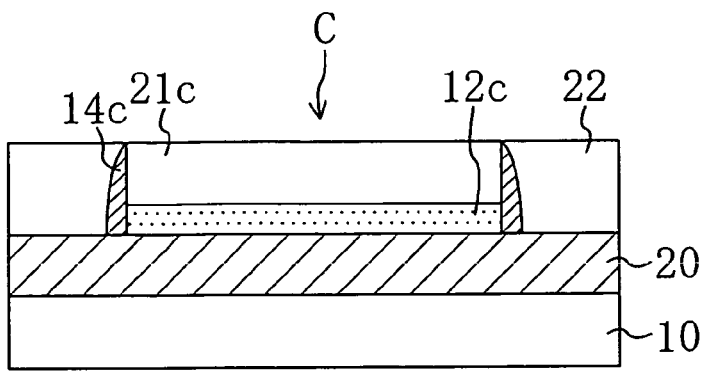
FIGS. 4A to 5D are step cross-sectional views showing a first example of a method for fabricating a capacitor element according to a second embodiment of the present invention.

First, as shown in FIG. 4A, the silicon film and the protective film are formed on the isolation region 20 formed in the surface of the semiconductor substrate 10 and then patterned to form the capacitor forming portion C composed of the silicon film 12c and the protective film 21c. Subsequently, the sidewall insulating film 14c is formed on each of the side surfaces of the capacitor forming portion C. Thereafter, the planarized insulating film 22 is formed on the portion of the semiconductor substrate 10 on which the capacitor formation portion C is not formed. The steps described thus far are the same as those shown in FIGS. 1A to 1C.

Figure 4B:
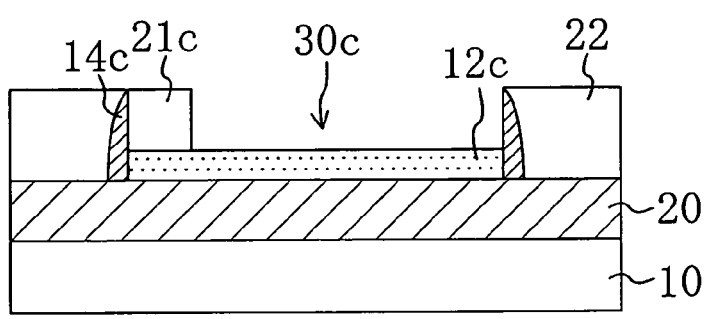

Next, as shown in FIG. 4B, the insulating film 21c is selectively removed from the capacitor forming portion C so that the silicon film 12c is exposed in the depressed portion 30c surrounded by the sidewall insulating film 14c. At this time, the insulating film 21c in contact with the sidewall insulating film 14c is partly left on the region of the silicon film 12c which forms a contact formation region of the lower electrode.

Figure 4C:
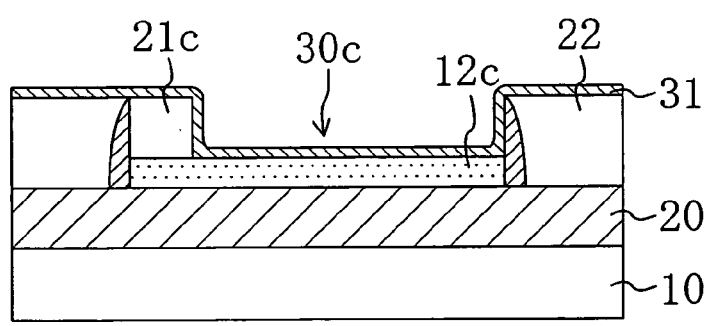
Figure 4D:
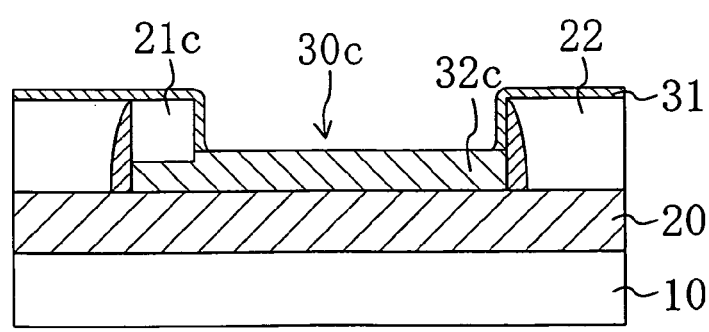

Then, as shown in FIG. 4C, the first metal film 31 is deposited entirely over the semiconductor substrate 10. Subsequently, a thermal process is performed to change the silicon film 12c into the first metal silicide film 32c (FIG. 4D).

Figure 5A:
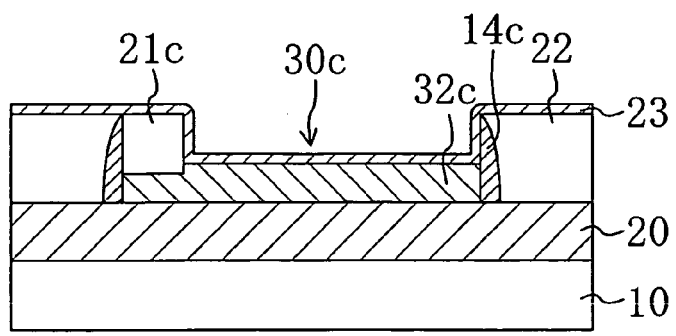
Figure 5B:
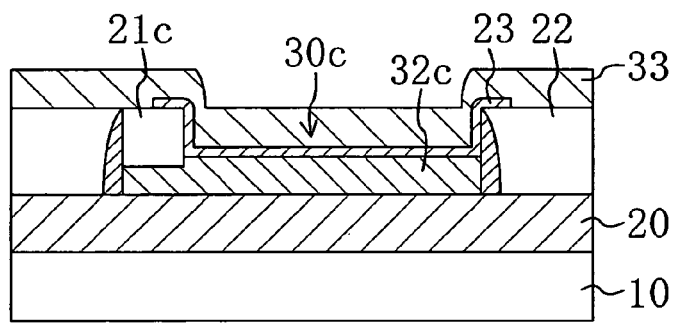

Next, as shown in FIG. 5A, the unreacted portion of the first metal film 31 is removed and then the insulating film 23 is formed entirely over the semiconductor substrate 10. Then, as shown in FIG. 5B, the insulating film 23 is patterned to form the insulating film 23 covering the first metal silicide film 32c. Thereafter, the second metal film 33 is formed entirely over the semiconductor substrate 10. At this time, the second metal film 33 is formed to have a thickness such that the depressed portion 30c is completely filled therewith.

Figure 5C:
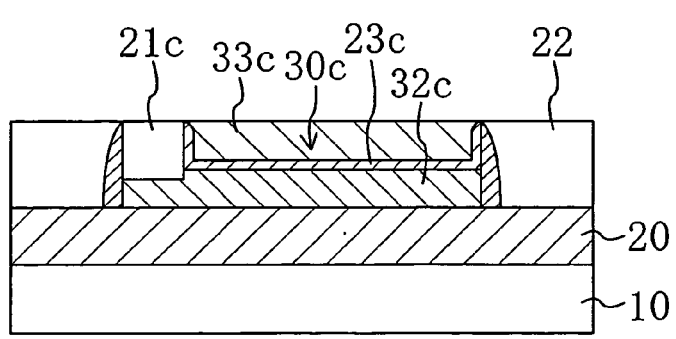

Next, as shown in FIG. 5C, the second metal film 33 is removed by polishing using a CMP method until the upper surface of the insulating film 22 is exposed. At this time, the insulating film 23 remaining on the insulating film 22 is also preferably polished away. As a result, a structure is obtained in which the insulating film 21c remaining on the contact formation region, the insulating film 23c having a depressed cross-sectional configuration, and the second metal film 33c formed in a depressed portion located above the insulating film 23c are buried in the depressed portion 30c located above the first metal silicide film 32c. The respective upper surfaces of these films have been planarized to be flush with the upper surface of the insulating film 22.

Figure 5D:
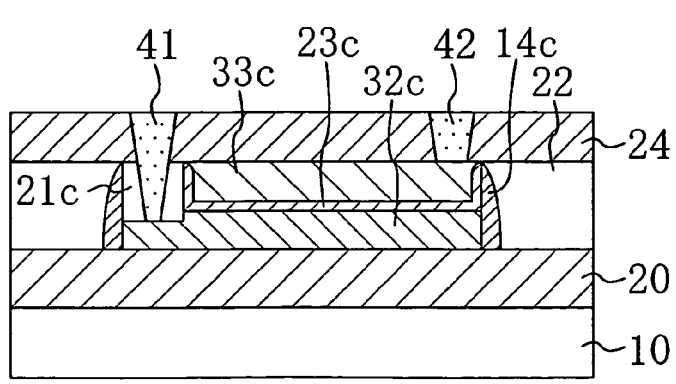

Finally, as shown in FIG. 5D, the interlayer insulating film 24 is formed entirely over the semiconductor substrate 10. Then, a contact hole reaching the metal silicide film 32c composing the lower electrode is formed in each of the interlayer insulating film 24 and the insulating film 23c, while a contact hole reaching the second metal film 33c composing the upper electrode is formed in the interlayer insulating film 24. Thereafter, contact plugs 41 and 42 each made of a conductive material are formed in the respective contact holes.

As a result, the capacitor element has the lower electrode composed of the first metal silicide film 32c formed on the isolation region 20, the capacitor insulating film composed of the insulating film 23c formed on the first metal silicide film 32c and having a depressed cross-sectional configuration, the upper electrode composed of the second metal film 33c formed in the depressed portion located above the insulating film 23c, and the insulating film 21C formed on the contact formation region of the first metal silicide film 32c (lower electrode). In the resulting structure, the contact plug 41 provided to extend through the interlayer insulating film 24 and the insulating film 21c is connected to the first metal silicide film 32c (lower electrode), while the contact plug 42 provided to extend through the interlayer insulating film 24 is connected to the second metal film 33c (upper electrode). In the present example, the insulating film 23c and the second metal film 33c are formed above the first metal silicide film 32c in the depressed portion 30c surrounded by the sidewall insulating film 14c and the upper surface of the second metal film 33c has been planarized to be substantially flush with the upper surface of the insulating film 22 and with the upper end of the sidewall insulating film 14c. In this structure, the contact plug 41 connected to the lower electrode (first metal silicide film 32a) is formed to extend through the insulating film 21c left on the inner side of the sidewall insulating film 14a. As a result, the potential at the lower electrode (first metal silicide film 32a) can be extracted to the surface of the interlayer insulating film 24 via the contact plug 41 without fluctuating the area occupied by the capacitor element.

EXAMPLE 2

FIGS. 6A to 7D are step cross-sectional views showing a second example of the method for extracting the potential at the lower electrode.

Figure 6A:
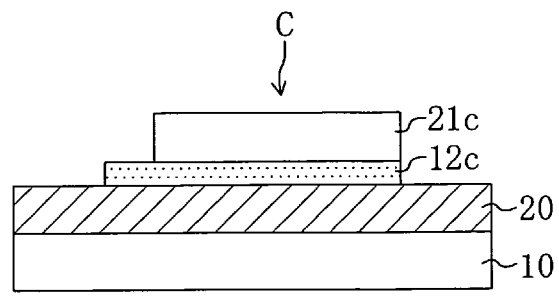
FIGS. 6A to 7D are step cross-sectional views showing a second example of the method for fabricating the capacitor element according to the second embodiment.

First, as shown in FIG. 6A, the silicon film and the protective film are formed on the isolation region 20 formed in the surface of the semiconductor substrate 10 and then patterned to form the capacitor forming portion C composed of the silicon film 12c and the protective film 21c. At this time, the insulating film 21c is patterned to have the end portion thereof located inwardly of the end portion of the silicon film 12c such that the contact formation region of the silicon film 12c is exposed.

Figure 6B:
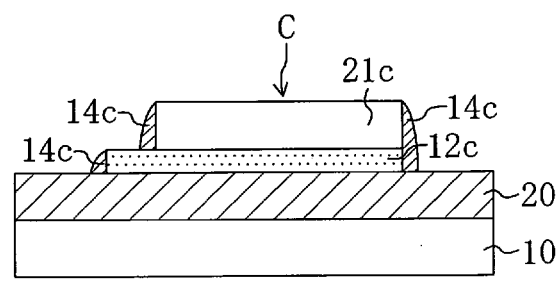

Next, as shown in FIG. 6B, the sidewall insulating film 14c is formed on each of the side surfaces of the capacitor formation portion C. At this time, the sidewall insulating film 14c is formed individually on the side surface of the insulating film 21c and on the side surface of the silicon film 12c in the stepped portion between the insulating film 21c and the silicon film 12c. As a result, the surface of the contact formation region of the silicon film 12c is exposed.

Figure 6C:
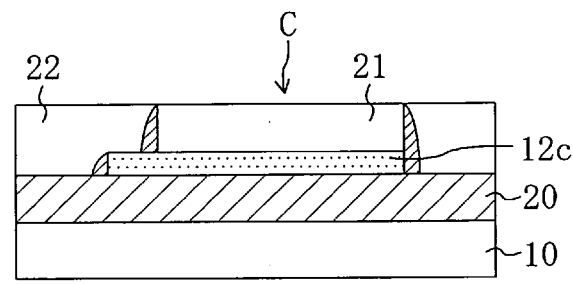
Figure 6D:
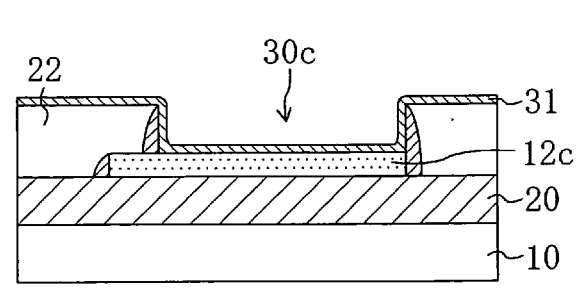

Then, as shown in FIG. 6C, the planarized insulating film 22 is formed on the portion of the semiconductor substrate 10 on which the capacitor forming portion C is not formed. Subsequently, as shown in FIG. 6D, the insulating film 21c is selectively removed from the capacitor forming portion C so that the silicon film 12c is exposed in the depressed portion 30c surrounded by th sidewall insulating film 14c. Thereafter, the first metal film 31 is deposited entirely over the semiconductor substrate 10.

Figure 7A:
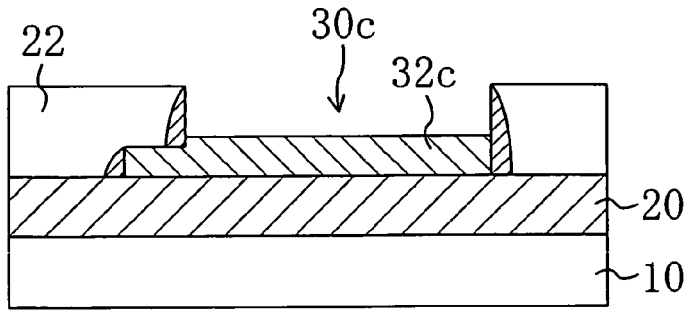

Next, as shown in FIG. 7A, a thermal process is performed to change the silicon film 12c into the first metal silicide film 32c. Then, the unreacted portion of the first metal film 31 is removed.

Figure 7B:
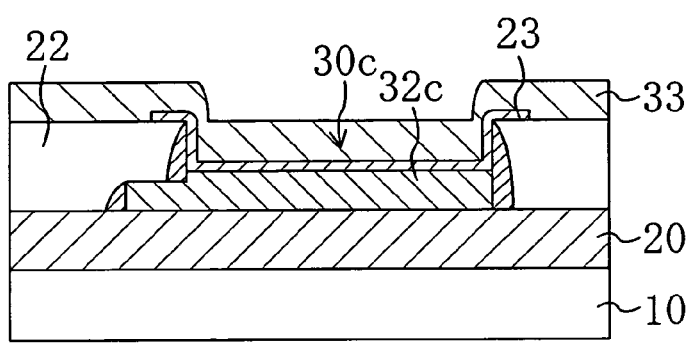

Next, as shown in FIG. 7B, the insulating film 23 is formed entirely over the semiconductor substrate 10 and then patterned to form the insulating film 23 covering the first metal silicide film 32c. Thereafter, the second metal film 33 is formed entirely over the semiconductor substrate 10. At this time, the second metal film 33 is formed to have a thickness such that the depressed portion 30c is completely filled therewith.

Figure 7C:
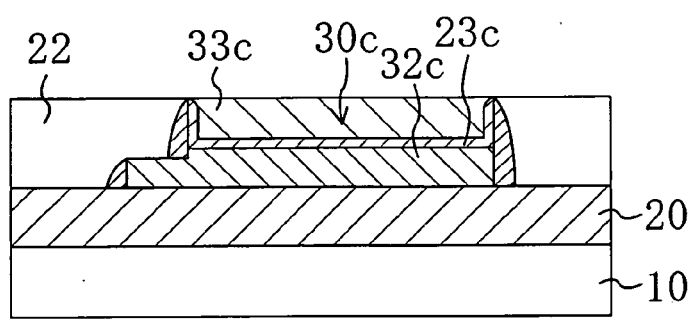

Next, as shown in FIG. 7C, the second metal film 33 is removed by polishing using a CMP method until the upper surface of the insulating film 22 is exposed. At this time, the insulating film 23 remaining on the insulating film 22 is also preferably polished away. As a result, a structure is obtained in which the insulating film 23c having a depressed cross-sectional configuration and the second metal film 33c formed in the depressed portion located above the insulating film 23c are buried in the depressed portion 30c located above the first metal silicide film 32c. The respective upper surfaces of these films have been planarized to be flush with the upper surface of the insulating film 22. At this time, the planarized insulating film 22 is formed on the contact formation region of the first metal silicide film 32c.

Figure 7D:
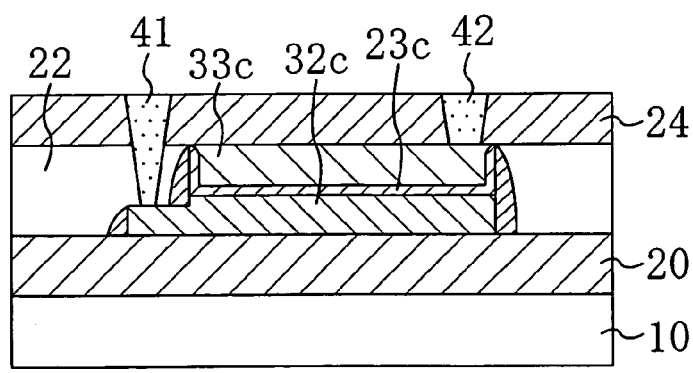

Finally, as shown in FIG. 7D, the interlayer insulating film 24 is formed entirely over the semiconductor substrate 10. Then, a contact hole reaching the metal silicide film 32c composing the lower electrode is formed in each of the interlayer insulating film 24 and the insulating film 22, while a contact hole reaching the second metal film 33 composing the upper electrode is formed in the interlayer insulating film 24. Thereafter, the contact plugs 41 and 42 each made of a conductive material are formed in the respective contact holes.

The capacitor element is different from the capacitor element shown in FIG. 5D in that the contact plug 41 connected to the first metal silicide film 32c (lower electrode) is provided to extend through each of the interlayer insulating film 24 and the insulating film 22. In the resulting structure, the contact plug 41 connected to the lower electrode (first metal silicide film 32a) is formed to extend through the insulating film 22 on the stepped portion between the lower electrode (first metal silicide film 32a) and the upper electrode (second metal film 33c). As a result, the potential at the lower electrode (first metal silicide film 32a) can be extracted to the surface of the interlayer insulating film 24 via the contact plug 41 without fluctuating the area occupied by the capacitor element.

Variations

Figure 8:
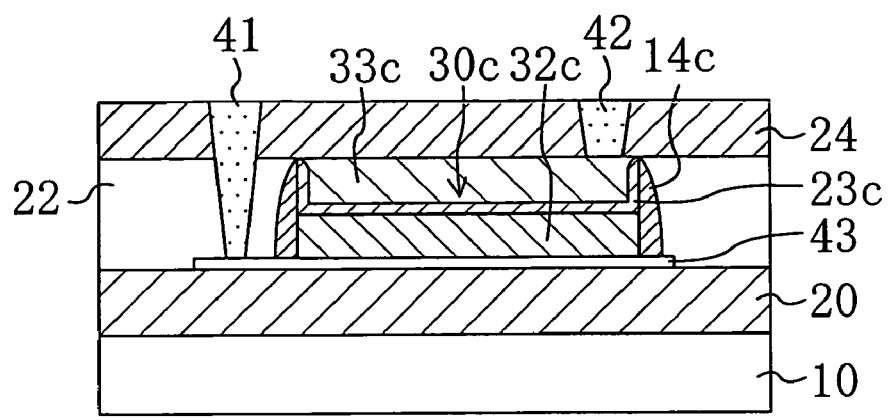
FIG. 8 is a cross-sectional view showing a variation of the capacitor element according to the second embodiment.
Figure 9:
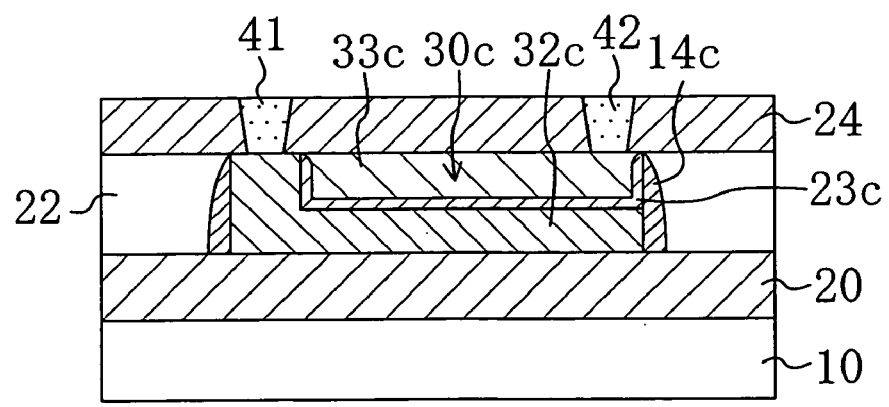
FIG. 9 is a cross-sectional view showing another variation of the capacitor element according to the second embodiment.
Figure 10A:
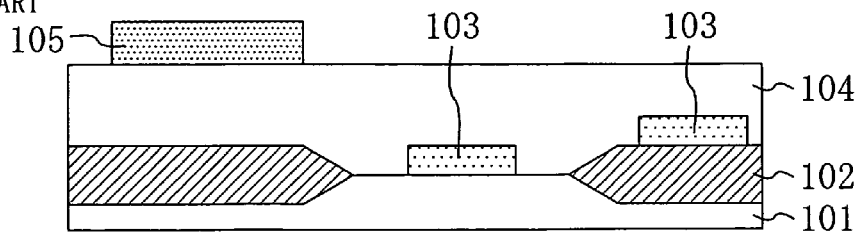
FIGS. 10A to 11D are step cross-sectional views showing a method for fabricating a conventional capacitor element.
Figure 10B:
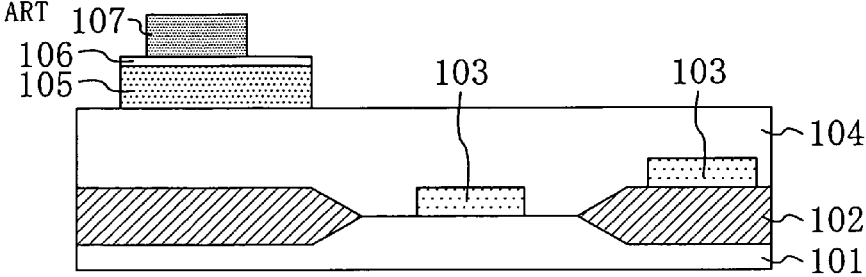
Figure 10C:
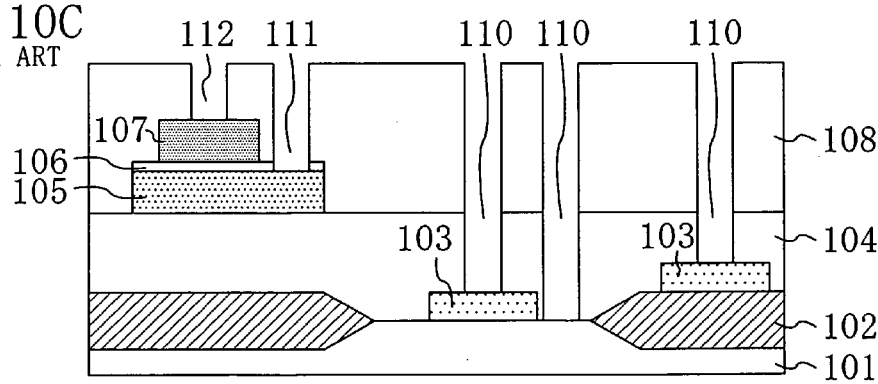
Figure 10D:
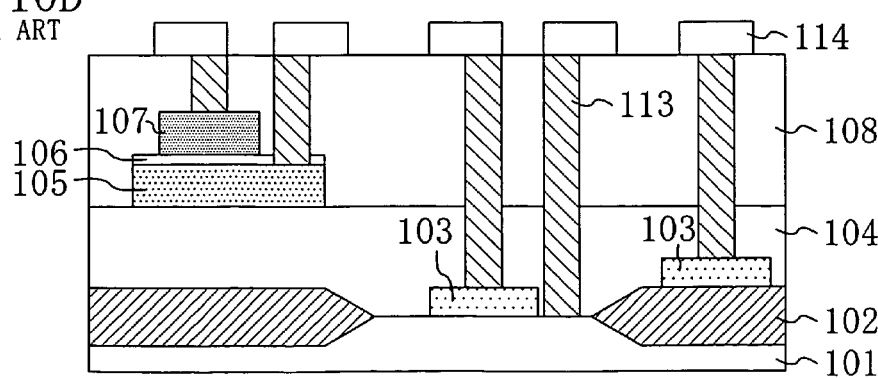
Figure 11A:
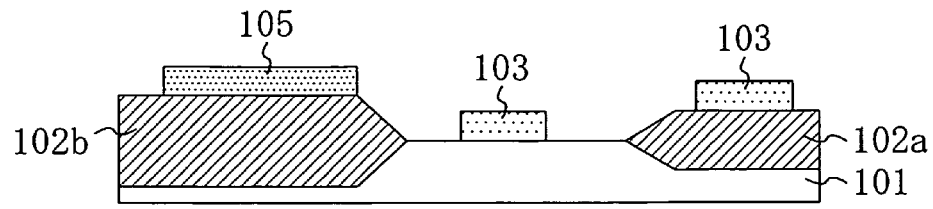
Figure 11B:
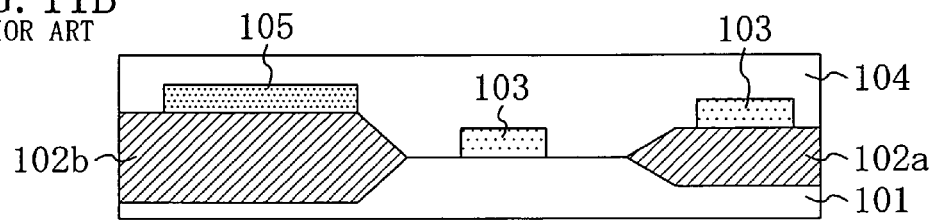
Figure 11C:
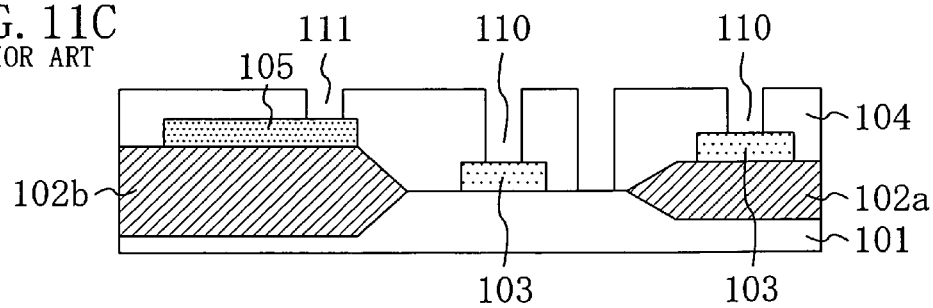
Figure 11D:
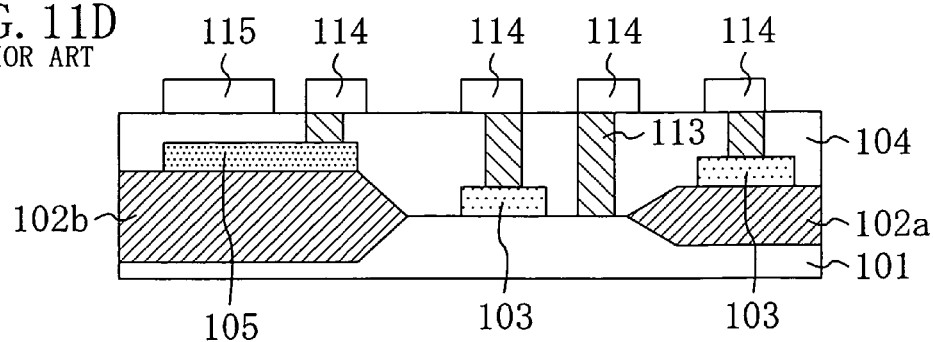

The potential at the lower electrode can also be extracted by using other methods besides the methods described above in the first and second embodiments, such as those shown in FIGS. 8 and 9.

The example shown in FIG. 8 preliminarily forms a conductive film 43 for extraction under the silicon film 12c in forming the silicon film 12c on the isolation region 20 and thereby extracts the potential at the lower electrode (first metal silicide film 32c) to the surface of the interlayer insulating film 24 via the conductive film 43 and the contact plug 41.

On the other hand, the example shown in FIG. 9 forms the extraction portion of the silicon film 12c such that the upper surface thereof is flush with the upper surface of the sidewall insulating film 14c in forming the silicon film 12c on the isolation region 20 and thereby extracts the potential at the lower electrode (first metal silicide film 32c) to the surface of the interlayer insulating film 24 via the extraction portion of the first metal silicide film 32c provided by silicidizing the extraction portion of the silicon film 12c.

Thus, various methods can be considered to extract the potential at the lower electrode of the capacitor element. Among them, an optimal method is preferably adopted in terms of the compatibility with the steps of forming another element than the capacitor element.

Although the present invention has been described by using the preferred embodiments thereof, it will easily be appreciated that the description is not restrictive and various changes and modifications can be made to the present invention. For example, although each of the embodiments described above has used the metal silicide film formed through the reaction between the silicon film and the first metal film to compose the lower electrode, the lower electrode can also be composed of the silicon film. In this case, when the complementary MIS transistor is formed simultaneously with the capacitor element, the gate electrode of the N-type MIS transistor is preferably composed of the silicon film, while the gate electrode of the P-type MIS transistor is preferably composed of the metal silicide.

What is claimed is:

1. A semiconductor device comprising a capacitor element, wherein the capacitor element comprises:
   a capacitor element portion having a lower electrode made of a metal silicide film formed on an isolation region provided in a semiconductor substrate, a capacitor insulating film made of a first insulating film formed on the lower electrode, and an upper electrode made of a metal film formed on the capacitor insulating film;
   a first sidewall insulating film formed on a side surface of the capacitor element portion; and
   a second insulating film formed on the semiconductor substrate in lateral relation to the first sidewall insulating film,
   wherein the capacitor element portion has an upper surface planarized to be flush with an upper surface of the second insulating film; and
   the first insulating film is disposed between the first sidewall insulating film and the upper electrode on a side surface of the upper electrode.

2. The semiconductor device of claim 1, wherein the meal silicide film is made of NiSi or $Ni_2Si$ and the metal film is made of a nickel film.

3. The semiconductor device of claim 1, further comprising a first MIS transistor, wherein the first MIS transistor comprises:

a first gate portion having a first gate insulating film formed on the semiconductor substrate, a first gate electrode made of a first metal silicide film formed on the first gate insulating film, the first insulating film formed on the first gate electrode, and the metal film formed on the first insulating film;

a second sidewall insulating film formed on a side surface of the first gate portion; and the second insulating film formed on the semiconductor substrate in lateral relation to the second sidewall insulating film, wherein the first gate portion has an upper surface planarized to be flush with the upper surface of the second insulating film.

4. The semiconductor device of claim 3, wherein the first metal silicide film has the same composition ratio as the metal silicide film.

5. The semiconductor device of claim 3, wherein the first MIS transistor is an N-type MIS transistor.

6. The semiconductor device of claim 1, further comprising a second MIS transistor, wherein the second MIS transistor comprises:

a second gate portion having a second gate insulating film formed on the semiconductor substrate and a second gate electrode made of a second metal silicide film formed on the second gate insulating film;

a third sidewall insulating film formed on a side surface of the second gate portion; and the second insulating film formed on the semiconductor substrate in lateral relation to the third sidewall insulating film, wherein the second gate portion has an upper surface planarized to be flush with the upper surface of the second insulating film.

7. The semiconductor device of claim 6, wherein the second metal silicide film is metal-richer than the metal silicide film.

8. The semiconductor device of claim 6, wherein the second metal silicide film is made of $Ni_3Si$.

9. The semiconductor device of claim 6, wherein the second MIS transistor is a P-type MIS transistor.

* * * * *